United States Patent [19]

Kawagoe

[11] 4,008,406
[45] Feb. 15, 1977

[54] ELECTRONIC CIRCUIT USING FIELD EFFECT TRANSISTOR WITH COMPENSATION MEANS

[75] Inventor: Hiroto Kawagoe, Kodaira, Japan

[73] Assignee: Hitachi, Ltd., Japan

[22] Filed: Sept. 11, 1975

[21] Appl. No.: 612,354

[30] Foreign Application Priority Data

Nov. 7, 1974 United Kingdom ............ 48264/74

[52] U.S. Cl. ............................... 307/304; 307/205; 307/214; 307/297; 307/310; 331/108 R
[51] Int. Cl.² ................. H03K 3/353; H03K 17/14; H03K 19/08; H03K 19/40
[58] Field of Search .......... 307/205, 269, 297, 304; 331/108 R, 108 C, 108 D, 330 35

[56] References Cited

UNITED STATES PATENTS

| | | | |
|---|---|---|---|
| 3,676,700 | 7/1972 | Buchanan | 307/205 |
| 3,678,407 | 7/1972 | Ahrons | 330/35 |
| 3,757,145 | 9/1973 | Adam et al. | 307/304 |
| 3,806,741 | 4/1974 | Smith | 307/304 |
| 3,831,041 | 8/1974 | Krambeck et al. | 307/304 |
| 3,832,644 | 8/1974 | Nagata et al. | 330/35 X |
| 3,875,430 | 4/1975 | Prak | 307/297 |

OTHER PUBLICATIONS

Askin et al., "FET Device Parameters Compensation Circuit;" IBM Tech. Discl. Bull.; vol. 14, No. 7, pp. 2088–2089; 12/1971.

Primary Examiner—John S. Heyman
Assistant Examiner—Larry N. Anagnos
Attorney, Agent, or Firm—Craig & Antonelli

[57] ABSTRACT

A compensation circuit for electronic circuits such as pulse generator circuits which are suitable for MOSICS includes a resistor of high resistance and parallel-connected MOSFETs of the enhancement type and depletion type, respectively. The drain electrodes of the MOSFETs are connected to a power supply through the resistor, and are also connected to the gate electrode of load MOSFET of the depletion type which constitutes a load for a MOSFET of the enhancement type. To the gate of the former enhancement type MOSFET, a controlled bias voltage is applied from the connection point of MOSFETs connected in series between the power supply and ground. By employing the compensation circuit in pulse generator circuits, the instability of the oscillating periods due to changes in the ambient temperature and changes in the supply voltage is compensated. Also, the differences of oscillating periods are decreased among MOSICs.

18 Claims, 9 Drawing Figures

COMPENSATION MEANS | INVERTER

COMPENSATION MEANS | INVERTER

ELECTRONIC CIRCUIT USING FIELD EFFECT TRANSISTOR WITH COMPENSATION MEANS

BACKGROUND OF THE INVENTION

1. Field of the Invention

The present invention relates to an electronic circuit, such as a pulse generator circuit, suitable for use as a metal-oxide-semiconductor integrated circuit and, particularly, a compensation circuit for stabilizing the operation of the electronic circuit, so that it is substantially insensitive to changes in ambient temperature and power supply voltage.

2. Description of the Prior Art

For the purpose of manufacturing small sized electronic calculators, using metal oxide semiconductor integrated circuits, improvements in the incorporation of all of the circuit elements necessary for the calculator into a single semiconductor chip have been effected.

To this end in one type of clock pulse generator circuit which is suitable for a MOSIC, there may be employed the closed-loop connected three inverter circuit having two capacitors between the inverters, as described in United States patent application Ser. No. 433,483, filed Jan. 15, 1974, by S. Shimada et al., and assigned to the assignee of the present application.

The oscillating period of this circuit, however, is unstable due to changes in the ambient temperature and power supply voltage. Moreover, when the circuit is employed in a MOSIC, the oscillating period varies over a wide range due to the differences in the electrical characteristics among the various MOSICs.

To compensate against this instability of the oscillating period of a MOSIC pulse generator, due to changes in ambient conditions and to compensate for the differences in the oscillating periods among mass-produced pulse generators produced in MOSIC form, there may be employed the compensation circuit described in U.S. patent application Ser. No. 453,168, filed on Mar. 20, 1974, now U.S. Pat. No. 3,975,649, by Kawagoe et al., also assigned to the assignee of the present application. As is shown in FIG. 1, this compensation circuit comprises a high resistance 4, one end of which is connected to a power supply terminal $-V_{GG}$, an enhancement type MOSFET 5 and a depletion type MOSFET 6 connected in parallel with MOSFET 5. The drain electrodes of MOSFETs 5 and 6 are connected together to the other end of the high resistance 4, while the source electrodes thereof are grounded. The gate electrode of MOSFET 5 is connected to the above-mentioned power supply terminal, while the gate electrode of MOSFET 6 is grounded.

The connection point of the other end of resistance 4 with the drain electrodes of MOSFETs 5 and 6 is connected to the gate of a depletion type MOSFET 1, which operates as a load for inverter MOSFET 2.

The resistance 4 should have a temperature coefficient which is much smaller than the temperature coefficient of MOSFETs 1 and 3. For the resistance 4, a resistor of a high, constant or linear resistance which is manufactured separately from the MOSIC may be employed.

Now, when the ambient temperature of the circuit increases, current flowing to the MOSFET 1 will decrease, since the mutual conductance gm of MOSFET 1 decreases. Similarly, the current flowing through MOSFETs 5 and 6 also decreases, resulting in a decrease in the voltage drop across the resistance 4. Namely, the voltage V between ground and the gate electrode 1 of MOSFET 1 will increase. This increased gate voltage V increases the current flowing through the MOSFET 1, so that changes in the electrical characteristics in the inverter circuit including MOSFETs 1 and 2, due to the change in the ambient temperature of the circuit, are compensated.

On the other hand, upon a decrease in the power supply voltage $-V_{GG}$, the voltage V between the gate of MOSFET 1 and ground will also increase. Moreover, the voltage applied to the gate of MOSFET 5 will necessarily increase, resulting in an increase in the current flowing through resistor 4, thereby increasing the voltage drop thereacross, so as to cause the voltage V to decrease, thereby balancing the voltage V irrespective of the change of the power supply voltage.

Furthermore, when MOSFETs 1 and 6 or MOSFETs 2 and 5 are manufactured in the same semiconductor chip under the same conditions, differences in the electrical characteristics are compensated among the mass-produced MOSICs. For example, for a high threshold voltage $V_{th}$ of MOSFET 1 within the MOSICs, the threshold voltage of $V_{th}$ of MOSFET 6 will also become high, which means that the current which flows to the MOSFET 6 will be relatively small. Thus, the voltage V will increase. As a result, the decrease of the current flowing through the MOSFET 1 due to its high threshold voltage $V_{th}$ is compensated by an increase in the bias voltage V. Thus, the compensation means will compensate for changes in the electrical characteristics among the various MOSICs. As a result, one can expect instability in the oscillating periods of the clock pulse generator circuits employing such compensation circuitry to be compensated.

In general, as shown in FIG. 3, the larger the voltage which is applied into the gate electrode of a MOSFET, then the smaller is the variation in the drain current. As a result, for the circuit shown in FIG. 1, since the gate electrode of MOSFET 5 is connected to a high voltage source $-V_{GG}$, the variation in the drain current of MOSFET 5 due to changes in the power supply voltage is small. Thus, the expected compensation against changes in the voltage V is not satisfactory.

Furthermore, since the bias voltage which is applied to the gate electrode of MOSFET 5 is larger than that which is applied to MOSFET 6, the drain current of MOSFET 6 will be less than that of MOSFET 5. As a result, the compensation function provided by MOSFET 6 will be less effective.

Also, since the bias voltage which is applied to the gate electrode of MOSFET 5 is large, the drain current through MOSFET 5 will be large, resulting in a large power consumption in high resistance 4.

BRIEF SUMMARY OF THE INVENTION

It is, accordingly, an object of the present invention to provide an improved compensation means to compensate for the instability of the electro characteristics of a MOSIC against changes in the power supply voltage.

It is another object of the present invention to provide an improved compensation means for compensating for the differences or variations in the threshold voltage values of enhancement type MOSFETs among mass-produced MOSICs.

It is a further object of the present invention to provide an improved compensation means using parallel-connected enhancement and depletion type MOSFETs wherein the compensation functions of the MOSFETs are balanced with respect to each other.

It is still another object of the present invention to provide a compensation means having a relatively low power consumption.

It is still an additional object of the present invention to provide a pulse generator circuit using enhancement/depletion type MOSFETs, which has a highly stable oscillating period relative to changes in ambient conditions of the circuit.

It is still a further object of the present invention to provide a pulse generator circuit which can be manufactured with enhancement/depletion MOSICs among which the variation in the oscillating period is extremely small.

In accordance with the present invention, the compensation means includes a resistor of a high resistance and parallel-connected MOSFETs which are of an enhancement and depletion type, respectively. The drain electrodes of the MOSFETs are connected to a power supply through the resistor, and are connected to the gate electrode of a depletion type load MOSFET, which acts as the load for an enhancement type MOSFET. To the gate electrode of the enhancement type MOSFET of the compensation means, a controlled bias voltage is applied from the common connection point of MOSFETs which are connected in series between the power supply and ground.

DETAILED DESCRIPTION

Figure 2:
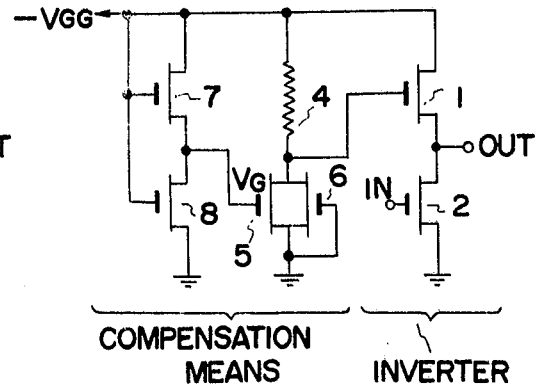
FIG. 2 is a circuit diagram of an embodiment of a compensation circuit in accordance with the present invention.

With reference now to FIG. 2 of the drawings, wherein the compensation means provided in accordance with the present invention in a MOSFET circuit is illustrated, an additional pair of MOSFETs 7 and 8 are connected in series between the power supply voltage $-V_{GG}$ and ground. Both MOSFETs 7 and 8 may be enhancement type MOSFETs, and each has its gate electrode connected to the power supply terminal. The common connection point between MOSFETs 7 and 8 is connected to the gate of MOSFET 5 to lower the gate bias voltage thereof. Namely, the voltage $-V_{GG}$ which is normally directly applied to the gate of MOSFET 5 is, by virtue of MOSFETs 7 and 8, applied across a voltage divider network made up of MOSFETs 7 and 8, so that a lowered voltage is applied to the gate electrode of MOSFET 5 from the connection point between MOSFETs 7 and 8.

Figure 3:
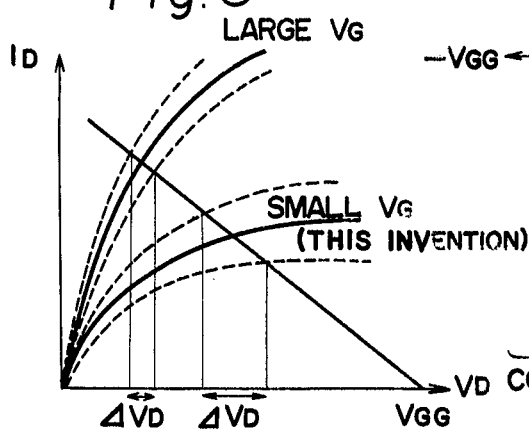
FIG. 3 depicts the relationship between the drain current and gate voltage for a MOSFET.

In operation, since the gate bias voltage of MOSFET 5 is decreased to a moderate value, by virtue of the voltage divider network 7 and 8, variations $\Delta V_D$ in the drain current of MOSFET 5, resulting from changes in the gate bias voltage, become large, as illustrated in FIG. 3. As a result, the instability of the electrical characteristics of the MOSIC is effectively compensated for changes in the power supply voltage $V_{GG}$. This also means that the compensation means according to the present invention compensates for variations in the threshold voltage values of the enhancement type MOSFETs among the mass-produced MOSICs, effectively.

As is illustrated in FIG. 3, the drain current of MOSFET 5 will decrease. By properly selecting the gate bias voltage, the drain current of MOSFET 5 can be balanced with respect to that of MOSFET 6. As a result, the compensation functions provided by MOSFETs 5 and 6 are balanced with respect to each other.

Furthermore, due to the decrease in the drain current of MOSFET 5, the overall current flowing through the resistor 4, which is connected to the drain electrodes of MOSFETs 5 and 6 will decrease. As a result, resistor 4 does not consume a large amount of power.

Figure 1:
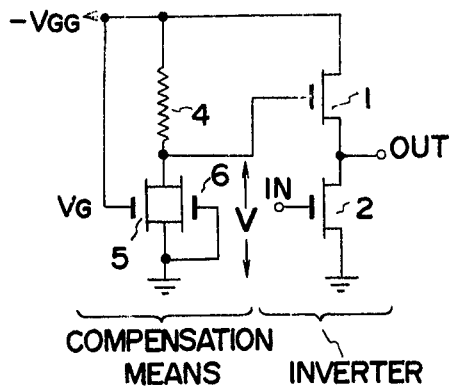
FIG. 1 is a circuit diagram of a previously proposed MOSFET compensation circuit.

In addition, instability as the result of changes in the power supply voltage $V_{GG}$ and due to changes in the gate threshold voltages is improved, the compensation functions provided by MOSFETs 5 and 6 are balanced with respect to each other, and variations in the oscillating period of a MOSIC-formed pulse generator is decreased to a value of only 10%, as compared with a 30% variation for the previously proposed compensation means shown in FIG. 1.

Figure 4:
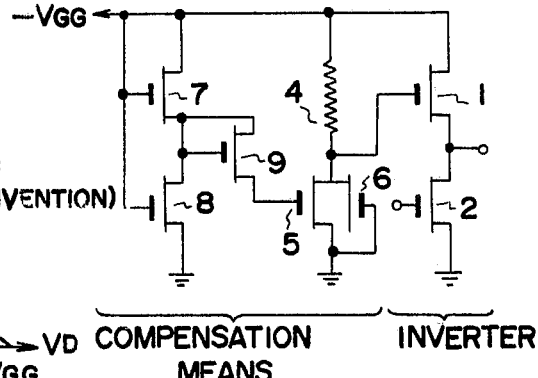
FIGS. 4–6 are circuit diagrams of further respective embodiments of the compensation circuit in accordance with the present invention.
Figure 5:
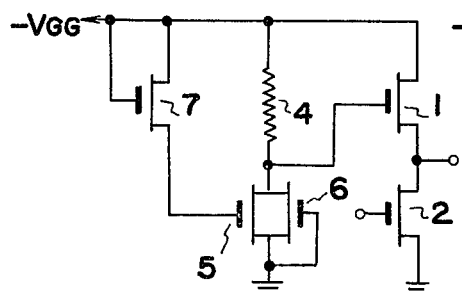

In a second embodiment of the present invention, shown in FIG. 4, a further enhancement MOSFET 9 may be connected between the gate electrode of MOSFET 5 and the common connection point of MOSFETs 7 and 8. Moreover, in place of a voltage divider made up of a pair of MOSFETs 7 and 8, shown in FIG. 2, a single voltage dropping MOSFET 7, with its gate and drain connected to the power supply terminal, as shown in FIG. 5, may be employed.

Figure 6:
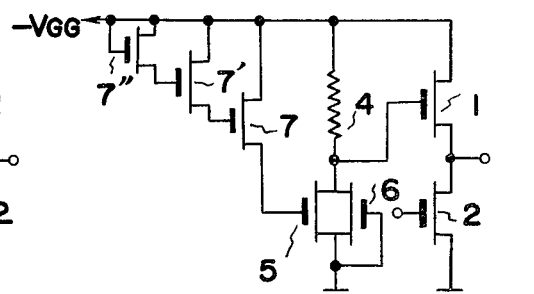

Also, multiple-enhancement MOSFETs 7, 7' and 7" may be connected between the gate electrode of MOSFET 5 and the power supply terminal, as shown in FIG. 6.

Furthermore, instead of MOSFETs 7 and 8, shown in FIG. 2, appropriate linear resistance elements may be substituted therefor. Furthermore, the drain and gate electrodes of MOSFET 7, in the above embodiments, may be connected to a drain power supply voltage $-V_{DD}$, instead of the gate power supply voltage $-V_{GG}$.

Figure 7:
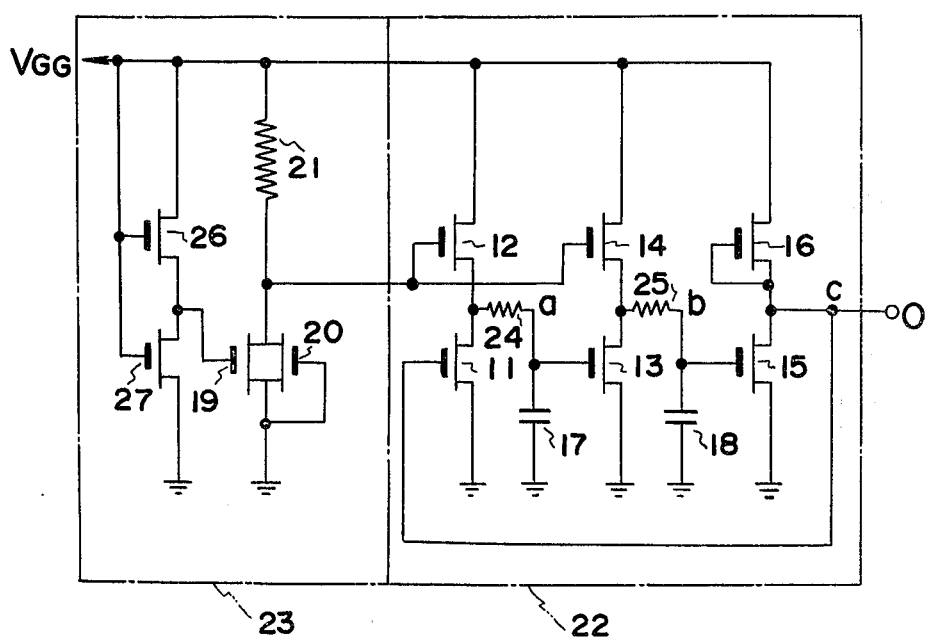
FIG. 7 is a circuit diagram of a pulse generator circuit employing the compensation means in accordance with the present invention.

As was mentioned previously, the compensation means in accordance with the present invention is especially suitable for use in a pulse generator circuit manufactured as a MOSIC. FIG. 7 illustrates a circuit diagram of an embodiment of the invention employed in such a pulse generator circuit, wherein pulse generator circuit 22 has a compensation means 23 connected between the power supply voltage terminal $V_{GG}$ and the pulse generator proper.

In FIG. 7, numerals 11, 13, 15, 19, 26 and 27 are P-channel enhancement type insulated gate field effect transistors, while MOSFETs 12, 14, 16 and 20 are P-channel depletion type transistors. Connected between the drains of MOSFETs 20 and 19 and the power supply terminal is a high resistance resistor 21 having a resistance of, for example, 50 KΩ to 300 KΩ. Capacitors 17 and 18 having values of, for example, 0.1 to 10pF are connected between the gate electrodes of MOSFETs 13 and 15 and ground. The drain electrodes of MOSFETs 11 and 13 are respectively connected to the gate electrodes of MOSFETs 13 and 15 by way of resistors 24 and 25, which may have values of 10 KΩ, for example.

MOSFETs 11–16, 19, 20, 26 and 27, capacitors 17 and 18, and resistors 24 and 25 are formed within the same monocrystalline silicon single chip as a MOSIC. High value resistor 21 is connected externally to the MOSIC.

Inverter MOSFETs 11, 13 and 15 are connected in cascade, within the pulse generator circuit 22, to form a closed loop. The MOSFETs 12, 14 and 16 are connected as loads for the inverter MOSFETs 11, 13 and 15, respectively.

MOSFETs 19 and 20 are connected in parallel between a source of common reference potential (ground) and one end of the resistor 21. The gate of the depletion type MOSFET 20 is connected to its source electrode and, thereby, to ground.

The gate electrodes of MOSFETs 12 and 14 are connected in common to the connection point between high value resistor 21 and the drain electrodes of parallel-connected MOSFETs 19 and 20, while the gate electrode of MOSFET 16 is connected to the source thereof.

In order to supply a moderate bias voltage to the gate of MOSFET 19, the compensation circuit 23 comprises MOSFETs 26 and 27, connected in series between the power supply terminal ($-V_{GG}$) and ground. The gate electrodes of MOSFETs 26 and 27 are connected to the power supply terminal so as to be rendered conductive. As a result, a bias voltage which is proportional to the supply voltage will be divided across MOSFETs 26 and 27 in accordance with the resistance ratio thereof, and will be supplied to the gate electrode of MOSFET 19 from the connection point of MOSFETs 26 and 27, in the same manner as the moderate bias supply voltage is connected to the gate electrode of MOSFET 5, discussed previously in connection with FIG. 2.

Figure 9:
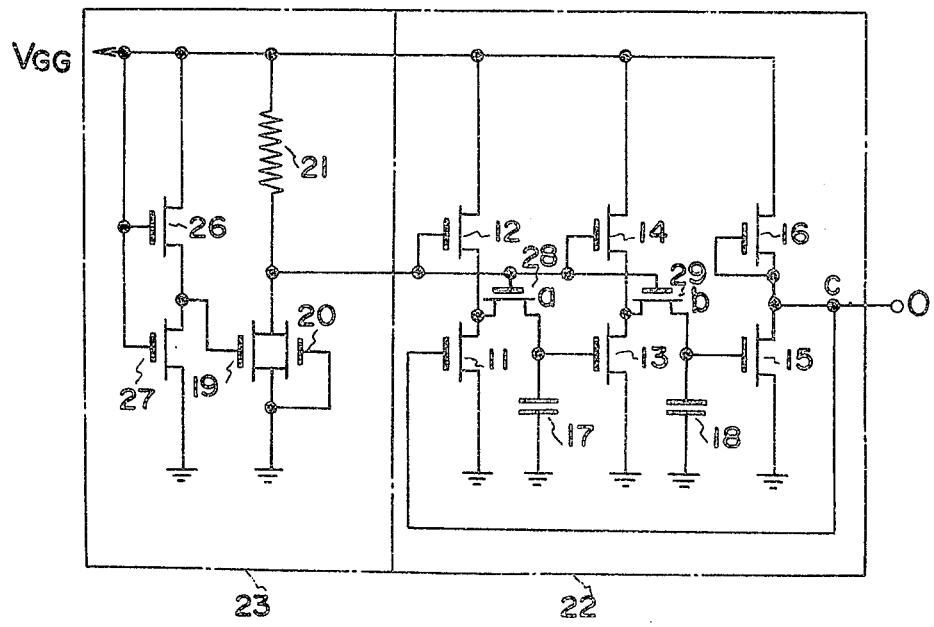
FIG. 9 is a circuit diagram of a modification of the pulse generator circuit shown in FIG. 7.

Resistors 24 and 25, within the pulse generator circuit 22, proper, are for the purpose of increasing the time constant of the RC elements 17–24 and 18–13. As a modification, the pulse generator circuit may have resistors 24 and 25 replaced by depletion type MOSFETs 28 and 29 as illustrated in FIG. 9.

Figure 8:
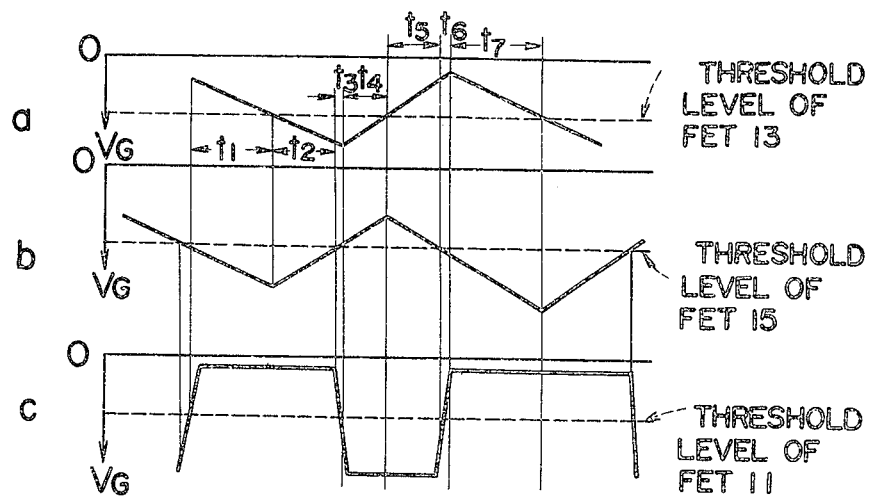
FIG. 8 is a timing diagram for illustrating the operation of FIG. 7.

Referring now to FIG. 8, the operation of the pulse generator circuit portion 22 of FIG. 7 will be explained.

It is presumed, during a period of time $t_1$, that MOSFET 15 is conductive, so that the junction c will have a voltage lower than the threshold voltage of MOSFET 11, while MOSFET 13 will be cut off, so that capacitor 18 will be charged by a current flowing through the load MOSFET 14 and resistor 25. It is also assumed, during the period of time $t_1$, that capacitor 17 begins to charge, since MOSFET 11 is switched to the cut-off state.

Under these conditions, when the output a of the first inverter circuit exceeds the threshold voltage of MOSFET 13, during the period of time $t_2$, as shown in curve a, of FIG. 8, MOSFET 13 will begin to conduct. As a result, the charge stored in the capacitor 18 begins to discharge through MOSFET 13.

Subsequently, when the output b of the second inverter circuit drops below the threshold voltage of MOSFET 15, during a period of time $t_3$, as shown in curve b of FIG. 8, MOSFET 15 will be rendered non-conductive. At this time, there will be a rapid change in the voltage at the output terminal c, since the output of the MOSFET 15 does not include a large capacitance. As a result, when the output c of MOSFET 15 exceeds the threshold voltage of the MOSFET 11, during a period of time $t_4$, as shown in curve c of FIG. 8, MOSFET 11 begins to conduct.

Moreover, when the output a of MOSFET 11 drops below the threshold voltage of MOSFET 13, during period of time $t_5$, MOSFET 13 is cut off. At this time, MOSFET 15 does not change its state.

When the output b of MOSFET 13 exceeds the threshold voltage of MOSFET 15, MOSFET 15 becomes conductive and the output c immediately drops to ground. When the output c becomes lower than the threshold level of the MOSFET 11, during period of time $t_7$, MOSFET 11 will shift to the cut-off state and the voltage at the output a will gradually increase. Thereafter, operations similar to those above are periodically repeated.

With this operation, the pulse voltage wave form shown in curve c, FIG. 8, will be generated from the output side of the third inverter MOSFET 15 to the output terminal O.

The oscillating period of the pulse generator 22, per se, is inherently unstable due to changes in the ambient temperature or the power supply voltage therefor. Also, when this pulse generator is mass-produced in the form of MOSICs, the MOSICs will have defects such as differences in the oscillating periods among the various circuits due to the differences in the electrical circuit parameters of the manufactured MOSFETs.

In order to compensate for these defects, a compensation means, made up of circuit 23, which is connected between the power supply terminal and the pulse generator 22 is employed in accordance with the present invention. As was described above in connection with FIG. 2, the compensation means comprises a high value resistor 21 which is connected to the MOSFETs 19 and 20, which, in turn, are connected to MOSFETs 12 and 14. With the compensation circuit 23, the compensation function is improved by controlling the gate bias voltage of MOSFET 19 by means of MOSFETs 26 and 27. MOSFET 20 is manufactured under the same manufacturing conditions as MOSFETs 12, 14 and 16, so as to have the same threshold voltage $V_{th}$ as MOSFETs 12, 14 and 16.

While the gate electrode of MOSFET 16 is connected to the source thereof in FIGS. 7 and 9 as one of the embodiments of the present invention, the gate electrode of MOSFET 16 can be connected to the connection point between resistor 21 and the drain electrodes of parallel-connected MOSFETs 19 and 20 in the same way as the gate electrodes of MOSFETs 12 and 14 without connecting the gate electrode of MOSFET 16 to the source electrode thereof, as another embodiment of the present invention.

When the ambient temperature of the pulse generator 22 increases, the current flowing through MOSFETs 12 and 14 will decrease, resulting in an increase in the time necessary to charge capacitors 17 and 18. Thus, without the compensation means, the period will be decreased.

According to the present invention, the current flowing through MOSFETs 19 and 20 will also decrease when the ambient temperature is increased. As a result, since the voltage drop across resistor 21 decreases, the gate voltage applied to the gates of MOSFETs 12 and 14 will increase, which causes an increase in the current flowing through the MOSFETs 12 and 14. Thus, compensation is provided to prevent a decrease in the oscillating period.

Similarly, when the power supply voltage $-V_{GG}$ increases, the increase of the current flowing through MOSFETs 12 and 14 will be compensated by an increase in the voltage drop across resistor 21, since the current flowing through MOSFET 19 also increases.

Moreover, when the pulse generator circuit is manufactured in the form of MOSICs, the oscillating periods which would differ among the MOSICs due to differences in the threshold voltages of MOSFETs 12 and 14 will be compensated for by the MOSFET 20 which is formed in each of the MOSICs under the same manufacturing conditions as MOSFETs 12, 14 and 16.

While I have shown plural embodiments in accordance with the present invention, it is understood that the same is not limited thereto but is susceptible of numerous changes and modifications known to a person skilled in the art and I therefore do not wish to be limited to the details shown and described herein but intend to cover all such changes and modifications as are obvious to one of ordinary skill in the art.

What is claimed is:

1. In an electronic circuit having
   first and second field effect transistors connected in series between a terminal for connecting a source of reference potential and a terminal for connecting a power supply source thereto,
   a third field effect transistor, the source electrode of which is connected to said reference potential terminal, the gate electrode of which is connected to a bias voltage terminal, and the drain electrode of which is connected to the gate electrode of said second field effect transistor,
   a resistor connected between the drain electrode of said third field effect transistor and said power supply source terminal,
   the improvement comprising:
   first resistance means connected between said power supply source terminal and the gate electrode of said third field effect transistor for supplying said bias voltage to the gate of said third field effect transistor for improving the third transistor's response to unfavorable voltage fluctuations of said power supply.

2. The improvement according to claim 1, further comprising a fourth field effect transistor, the drain and source electrodes of which are respectively connected to the drain and source electrodes of said third field effect transistor, and the gate electrode of said fourth field effect transistor being connected to said reference potential terminal.

3. The improvement according to claim 2, wherein said first resistance means comprises a fifth field effect transistor, the source electrode of which is connected to the gate electrode of said third field effect transistor and the drain electrode of which is connected to said power supply source terminal.

4. The improvement according to claim 3, further comprising a sixth field effect transistor, the source electrode of which is connected to said reference potential terminal, and the drain and gate electrodes of which are respectively connected to the source of said fifth field effect transistor and said power supply source terminal.

5. The improvement according to claim 2, wherein said first and third transistors are enhancement type insulated gate field effect transistors and said second and fourth transistors are depletion type insulated gate field effect transistors.

6. The improvement according to claim 1, wherein said first resistance means comprises a fourth field effect transistor, the drain electrode of which is connected to said power supply source terminal and the source electrode of which is coupled to the gate electrode of said third field effect transistor.

7. The improvement according to claim 6, further comprising second resistance means coupled between the gate electrode of said third field effect transistor and said reference potential terminal.

8. The improvement according to claim 7, wherein said second resistance means comprises a fifth field effect transistor the drain electrode of which is connected to the source electrode of said fourth field effect transistor, the gate electrode of which is connected to said power supply source terminal, and the source electrode of which is connected to said reference potential terminal.

9. The improvement according to claim 8, further comprising a sixth field effect transistor, the gate and drain electrodes of which are commonly connected to the source electrode of said fourth field effect transistor and the drain electrode of said fifth field effect transistor, the source electrode of said sixth field effect transistor being connected to the gate electrode of said third field effect transistor.

10. The improvement according to claim 9, further comprising a seventh field effect transistor, the drain and source electrodes of which are respectively connected to the drain and source electrodes of said third field effect transistor, and the gate electrode of said seventh field effect transistor being connected to said reference potential terminal.

11. The improvement according to claim 8, further comprising a sixth field effect transistor, the drain and source electrodes of which are respectively connected to the drain and source electrodes of said third field effect transistor, and the gate electrode of said sixth field effect transistor being connected to said reference potential terminal.

12. The improvement according to claim 11, wherein said first, third, fourth and fifth transistors are enhancement type insulated gate field effect transistors and said second and sixth transistors are depletion type insulated gate field effect transistors.

13. The improvement according to claim 6, wherein the gate electrode of said fourth field effect transistor is connected to said power supply source terminal.

14. The improvement according to claim 13, further comprising a fifth field effect transistor, the drain and source electrodes of which are respectively connected to the drain and source electrodes of said third field effect transistor, and the gate electrode of said fifth field effect transistor being connected to said reference potential terminal.

15. The improvement according to claim 14, wherein said first, third, fourth and fifth transistors are enhancement type insulated gate field effect transistors and said second and sixth transistors are depletion type insulated gate field effect transistors.

16. The improvement according to claim 1, further comprising second resistance means coupled between the gate electrode of said third field effect transistor and said reference potential terminal.

17. The improvement according to claim 16, further comprising a fourth field effect transistor, the drain and source electrodes of which are respectively connected to the drain and source electrodes of said third field effect transistor, and the gate electrode of said fourth field effect transistor being connected to said reference potential terminal, and wherein said first and third transistors are enhancement type insulated gate field effect transistors and said second and fourth transistors are depletion type insulated gate field effect transistors.

18. A pulse generator circuit comprising a first, a second and a third insulated gate field effect transistor of the enhancement type, the drain electrode of the first transistor being connected to the gate electrode of the second transistor, the drain electrode of the second transistor being connected to the gate electrode of the third transistor, the drain electrode of the third transistor being connected to the gate electrode of the first transistor, and the source electrodes of the first, second and third transistors being connected to a first voltage source;

a fourth, a fifth and a sixth insulated gate field effect transistor of the depletion type, the source electrodes of the fourth, fifth and sixth transistors being connected to the drain electrodes of the first, second and third transistors, respectively, the drain electrodes of the fourth, fifth and sixth transistors being connected to a second voltage source, and at least the gate electrodes of the fourth and fifth transistors being connected in common;

a seventh insulated gate field effect transistor of the enhancement type;

an eighth insulated gate field effect transistor of the depletion type connected in parallel to said seventh transistor, the commonly connected source electrodes being connected to the first voltage source, the commonly connected drain electrodes being connected to the commonly connected gate electrodes of said fourth and fifth transistors, and the gate electrode of the eighth transistor being connected to the source electrode thereof;

a ninth and a tenth insulated gate field effect transistor having channels connected in series between said first and second voltage sources, and gate electrodes connected in common to said second voltage source;

means for connecting the connection point between ninth and tenth transistors with the gate electrode of said seventh transistor; and a resistor connected between the commonly connected drain electrodes of said seventh and eighth transistors and said second voltage source.

* * * * *